(12) United States Patent
Chang et al.

(10) Patent No.: US 10,514,613 B2
(45) Date of Patent: Dec. 24, 2019

(54) PATTERN MODIFICATION AND PATTERNING PROCESS

(71) Applicant: Taiwan Semiconductor Manufacturing Co., Ltd., Hsinchu (TW)

(72) Inventors: Shih-Ming Chang, Zhubei (TW); Ru-Gun Liu, Zhubei (TW); Shuo-Yen Chou, Ji-an Shiang (TW); Chien-Wen Lai, Hsinchu (TW); Zengqin Zhao, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/398,839

(22) Filed: Jan. 5, 2017

(65) Prior Publication Data

US 2018/0149982 A1 May 31, 2018

Related U.S. Application Data

(60) Provisional application No. 62/426,941, filed on Nov. 28, 2016.

(51) Int. Cl.
*G03B 27/52* (2006.01)
*G03F 7/20* (2006.01)
(Continued)

(52) U.S. Cl.
CPC .......... *G03F 7/70641* (2013.01); *G03F 7/038* (2013.01); *G03F 7/039* (2013.01); *G03F 7/2004* (2013.01); *G03F 7/34* (2013.01)

(58) Field of Classification Search
CPC ............. G03F 7/70433; G03F 7/70441; G03F 7/70425; G03F 1/144; G03F 7/038;
(Continued)

(56) References Cited

U.S. PATENT DOCUMENTS 5,447,810 A * 9/1995 Chen .................... G03F 7/70125
430/311
8,527,916 B1 9/2013 Chiang et al.
(Continued)

FOREIGN PATENT DOCUMENTS

JP 2012059875 A * 3/2012

*Primary Examiner* — Peter B Kim
(74) *Attorney, Agent, or Firm* — McClure, Qualey & Rodack, LLP

(57) ABSTRACT

A pattern modification method and a patterning process are provided. The method includes extracting a first pattern and a second pattern to be respectively transferred to a first target portion and a second target portion of a resist layer. The method also includes obtaining regional information of the first target portion and the second target portion. The method includes determining a first desired focus position for transferring the first pattern based on the regional information. In addition, the method includes determining a second desired focus position for transferring the second pattern based on the regional information. The method includes modifying one or both of the first pattern and the second pattern. As a result, focus positions of the first pattern and the second pattern are shifted to be substantially and respectively positioned at the first desired focus position and the second desired focus position during an exposure operation.

20 Claims, 18 Drawing Sheets

(51) Int. Cl.
*G03F 7/038* (2006.01)
*G03F 7/039* (2006.01)
*G03F 7/34* (2006.01)

(58) Field of Classification Search
CPC .......... G03F 7/039; G03F 7/2004; G03F 7/34; G03F 7/70641; G03F 7/70216
USPC .......................................................... 355/55
See application file for complete search history.

(56) References Cited

U.S. PATENT DOCUMENTS

| | | | |
|---|---|---|---|
| 8,572,520 B2 | 10/2013 | Chou et al. | |
| 8,589,828 B2 | 11/2013 | Lee et al. | |
| 8,589,830 B2 | 11/2013 | Chang et al. | |
| 8,627,241 B2 | 1/2014 | Wang et al. | |
| 8,631,360 B2 | 1/2014 | Wang et al. | |
| 8,631,361 B2 | 1/2014 | Feng | |
| 8,732,626 B2 | 5/2014 | Liu et al. | |
| 8,739,080 B1 | 5/2014 | Tsai et al. | |
| 8,745,550 B2 | 6/2014 | Cheng et al. | |
| 8,751,976 B2 | 6/2014 | Tsai et al. | |
| 8,762,900 B2 | 6/2014 | Shin et al. | |
| 8,812,999 B2 | 8/2014 | Liu et al. | |
| 8,850,366 B2 | 9/2014 | Liu et al. | |
| 2006/0236271 A1* | 10/2006 | Zach | G03F 1/36 716/30 |
| 2009/0004576 A1* | 1/2009 | Furukawa | G03F 7/70433 430/5 |
| 2010/0149503 A1* | 6/2010 | Goehnermeier | G03F 1/14 355/55 |
| 2013/0267047 A1 | 10/2013 | Shih et al. | |
| 2014/0101624 A1 | 4/2014 | Wu et al. | |
| 2014/0109026 A1 | 4/2014 | Wang et al. | |
| 2014/0120459 A1 | 5/2014 | Liu et al. | |
| 2014/0282334 A1 | 9/2014 | Hu et al. | |
| 2014/0347644 A1* | 11/2014 | Wu | G03F 7/70141 355/55 |

\* cited by examiner

PATTERN MODIFICATION AND PATTERNING PROCESS

PRIORITY CLAIM AND CROSS-REFERENCE

This Application claims the benefit of U.S. Provisional Application No. 62/426,941, filed on Nov. 28, 2016, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
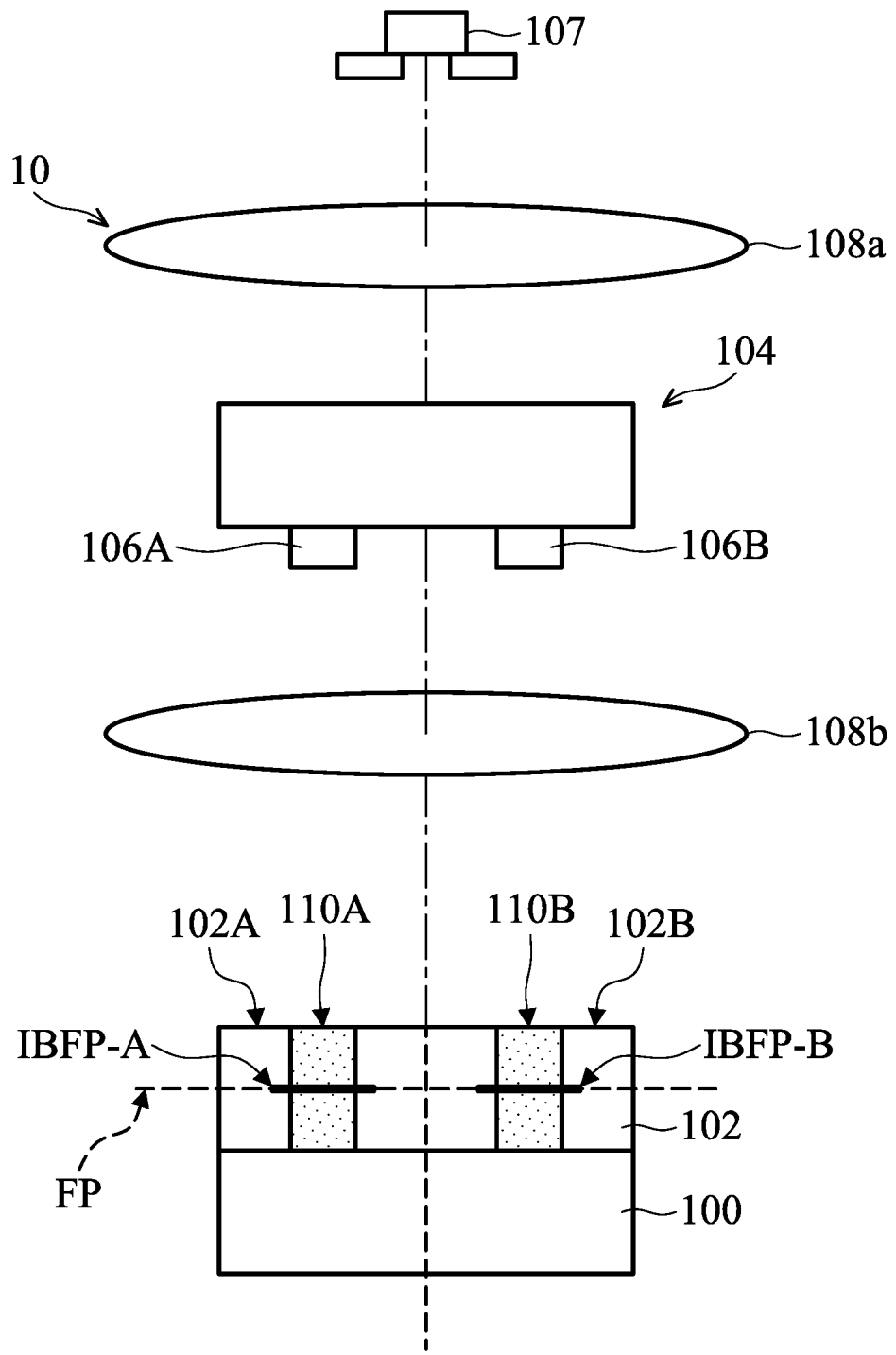
FIG. 1A is a cross-sectional view of an intermediate stage of a lithography process, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIG. 1A is a cross-sectional view of an intermediate stage of a lithography process, in accordance with some embodiments. In some embodiments, an exposure tool 10 is used to transfer patterns on a mask 104 onto a substrate 100 during a lithography process. The lithography process may employ light in, for example, the visible to the deep ultraviolet spectral range to expose a resist layer (such as a photoresist layer) 102 over the substrate 100. The mask 104 serves as a template for the device elements to be manufactured. The mask 104 contains patterns and features that are used to create desired circuit patterns onto the resist layer 102.

The exposure tool 10 may be a step-and-exposure tool, a scanner tool, or the like. In some embodiments, the exposure tool 10 includes an illumination source 107, an imaging system that includes lens subsystems 108a and 108b, and the mask 104. The illumination source 107 is configured to provide light beam during the lithography process. The illumination source 107 may operate, for example, at ultraviolet (UV), deep ultra-violet (DUV), extreme ultra-violet (EUV), or other suitable wavelengths.

The image system is configured to direct the light beam from the illumination source 107 to pass through the mask 104 and project light beam not blocked by the mask 104 onto the resist layer 102. The patterned light beam is projected onto the resist layer 102. As a result, patterns including patterns 106A and 106B on the mask 104 may be transferred to the resist layer 102. In some embodiments, the resist layer 102 is positive type. In some other embodiments, the resist layer 102 is negative type.

Figure 1B:
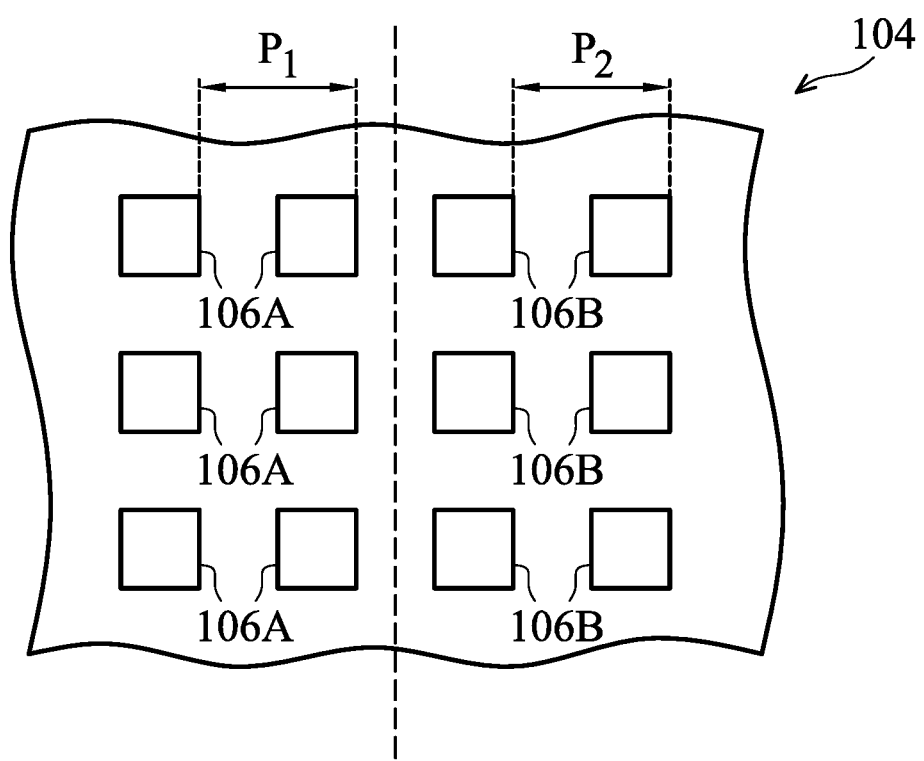
FIG. 1B is a top view of a mask, in accordance with some embodiments.

FIG. 1B is a top view of a mask with patterns, in accordance with some embodiments. In some embodiments, FIG. 1B is a top view of the mask 104 shown in FIG. 1A. As shown in FIGS. 1A and 1B, the mask 104 includes a number of first patterns 106A and a number of second patterns 106B. In some embodiments, the first patterns 106A and the second patterns 106B of the mask 104 are substantially identical. In some embodiments, the sizes and shapes of each of the first patterns 106A are substantially the same as each other. In some embodiments, the sizes and shapes of each of the second patterns 106B are substantially the same as each other. In some embodiments, one of the first patterns 106A and one of the second patterns 106B have substantially the same shape and size. In some embodiments, a first pitch $P_1$ between any adjacent two first patterns 106A is substantially the same as a second pitch $P_2$ between any adjacent two second patterns 106B.

For simplicity, only one of the first patterns 106A and one of the second patterns 106B are shown in FIG. 1A. As shown in FIG. 1A, the first pattern 106A is designed to be transferred to a first target portion 102A of the resist layer 102. The second pattern 106B is designed to be transferred to a second target portion 102B of the resist layer 102. As shown in FIG. 1A, after an exposure operation, the first pattern 106A and the second pattern 106B are transferred to the resist layer 102. As a result, patterns 110A and 110B are respectively formed in the first target portion 102A and the second target portion of the resist layer 102.

During the exposure operation, the process parameters of the exposure tool 10 may be fine-tuned to set the focus positions of the first pattern 106A and the second pattern 106B. In some embodiments, the focus positions of the first pattern 106A and the second pattern 106B are positioned at the same focus position FP (or the same plane). In some embodiments, the focus position FP is positioned at the individual best focus position IBFP-A for transferring the first pattern 106A to the first target portion 102A to form the pattern 110A. In some embodiments, the focus position FP is also positioned at the individual best focus position IBFP-B for transferring the second pattern 106B to the second target portion 102B to form the pattern 110B.

Since the focus position FP is positioned where the individual best focus positions IBFP-A and IBFP-B are located, the focus position FP may also be called a common best focus position (or a global best focus position). Because the first pattern 106A and 106B are respectively projected at their individual best focus positions IBFP-A and IBFP-B, the quality of the patterns 110A and 110B formed in the resist layer 102 is high.

However, in some cases, the first pattern 106A and the second pattern 106B are designed without considering the regional information (or local exposure condition) at the first target portion 102A and the second target portion 102B. The regional information (or local exposure condition) can be the topography, reflectivity, surface roughness, and/or surface chemical behavior of the beneath layers. In these cases, if the regional information at the first target portion 102A and the second target portion 102B are not identical, the focus position FP may not be positioned at the individual best focus position IBFP-A or IBFP-B. The quality of the patterns 110A and 110B formed in the resist layer 102 may be negatively affected.

Figure 2:
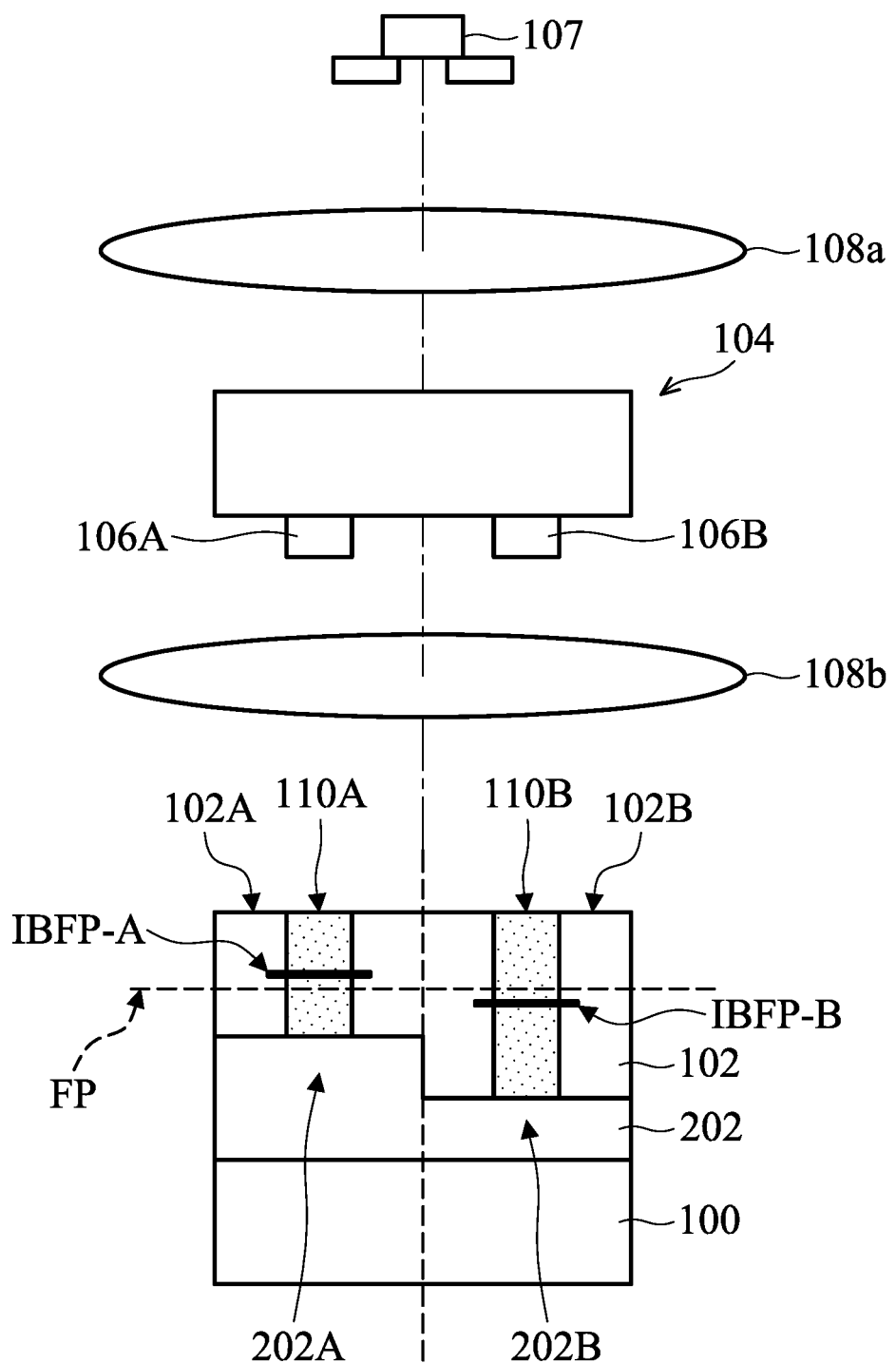
FIG. 2 is a cross-sectional view of an intermediate stage of a lithography process, in accordance with some embodiments.

FIG. 2 is a cross-sectional view of an intermediate stage of a lithography process, in accordance with some embodiments. In some embodiments, the exposure tool 10 is used to transfer patterns including the first pattern 106A and the second pattern 106B on the mask 104 onto the resist layer 102 over the substrate 100 during a lithography process. In some embodiments, FIG. 1B shows the top view of the mask 104 shown in FIG. 2.

As shown in FIG. 2, a material layer 202 with regional topography difference is between the substrate 100 and the resist layer 102, in accordance with some embodiments. Due to the material layer 202, the regional information (or local exposure condition) at the first target portion 102A is different from that at the second target portion 102B.

In some embodiments, top surfaces of the first target portion 102A and the second target portion 102B are substantially coplanar with each other, as shown in FIG. 2. In some embodiments, the second target portion 102B is thicker than the first target portion 102A, which may cause local exposure condition difference between the first target portion 102A and 102B.

As shown in FIG. 2, the material layer 202 has a first portion 202A and a second portion 202B. The first portion 202A is directly below the first target portion 102A of the resist layer 102. The second portion 202B is directly below the first target portion 102A of the resist layer 102. In some embodiments, there is no intermediate layer formed between the material layer 202 and the resist layer 102. The term "directly below" here is not intended to mean that the material layer 202 has to be in direct contact with the resist layer 102. In some embodiments, there is one or more intermediate layers formed between the material layer 202 and the resist layer 102. In some embodiments, the material layer 202 is not in direct contact with the resist layer 102. However, many variations and/or modifications can be made to embodiments of the disclosure. In some other embodiments, the material layer 202 is in direct contact with the resist layer 102.

The material layer 202 may include a dielectric layer, a metal layer, a semiconductor layer, another suitable layer, or a combination thereof. In some embodiments, the material layer 202 is a single layer. In some other embodiments, the material layer 202 has multiple sub-layers. In some embodiments, the sub-layers are made of the same material. In some other embodiments, two or more of the sub-layers are made of different materials.

The material layer 202 may also cause local exposure condition difference between the first target portion 102A and 102B. As shown in FIG. 2, the topography of the material layer 202 under the first target portion 102A is different from that under the second target portion 102B. As shown in FIG. 2, the first portion 202A is thicker than the second portion 202B of the material layer 202, in accordance with some embodiments. In some embodiments, a top surface of the first portion 202A is at a higher vertical level than a top surface of the second portion 202B with respect to a bottom surface of the substrate 100, as shown in FIG.

2. In some embodiments, the exposure light may partially penetrate through the material layer 202. The topography different between the first portion 202A and the second portion 202B of the material layer 202 may also cause local exposure condition difference between the first target portion 102A and the second target portion 102B.

In some embodiments, the patterns of the mask 104 shown in FIGS. 1A and 2 are the same. However, the quality of the first pattern 110A and the second pattern 110B accordingly formed in the resist layer may not be as good as those shown in FIG. 1A. Because the regional information (or local exposure condition) at the first target portion 102A and the second target portion 102B are different, the individual best focus positions IBFP-A and IBFP-B are not positioned at the same plane. In some embodiments, the process parameters of the exposure tool 10 may be fine-tuned to set a particular focus position FP. However, as shown in FIG. 2, the focus position FP is between the individual best focus positions IBFP-A and IBFP-B. Neither the first pattern 106A nor the second pattern 106B is projected at the best focus positions. Therefore, individual process window of the first pattern 106A and the second pattern 106B are not fully overlapped. It makes the common process window smaller than either the individual process window of 106A or 106B.

Figure 3A:
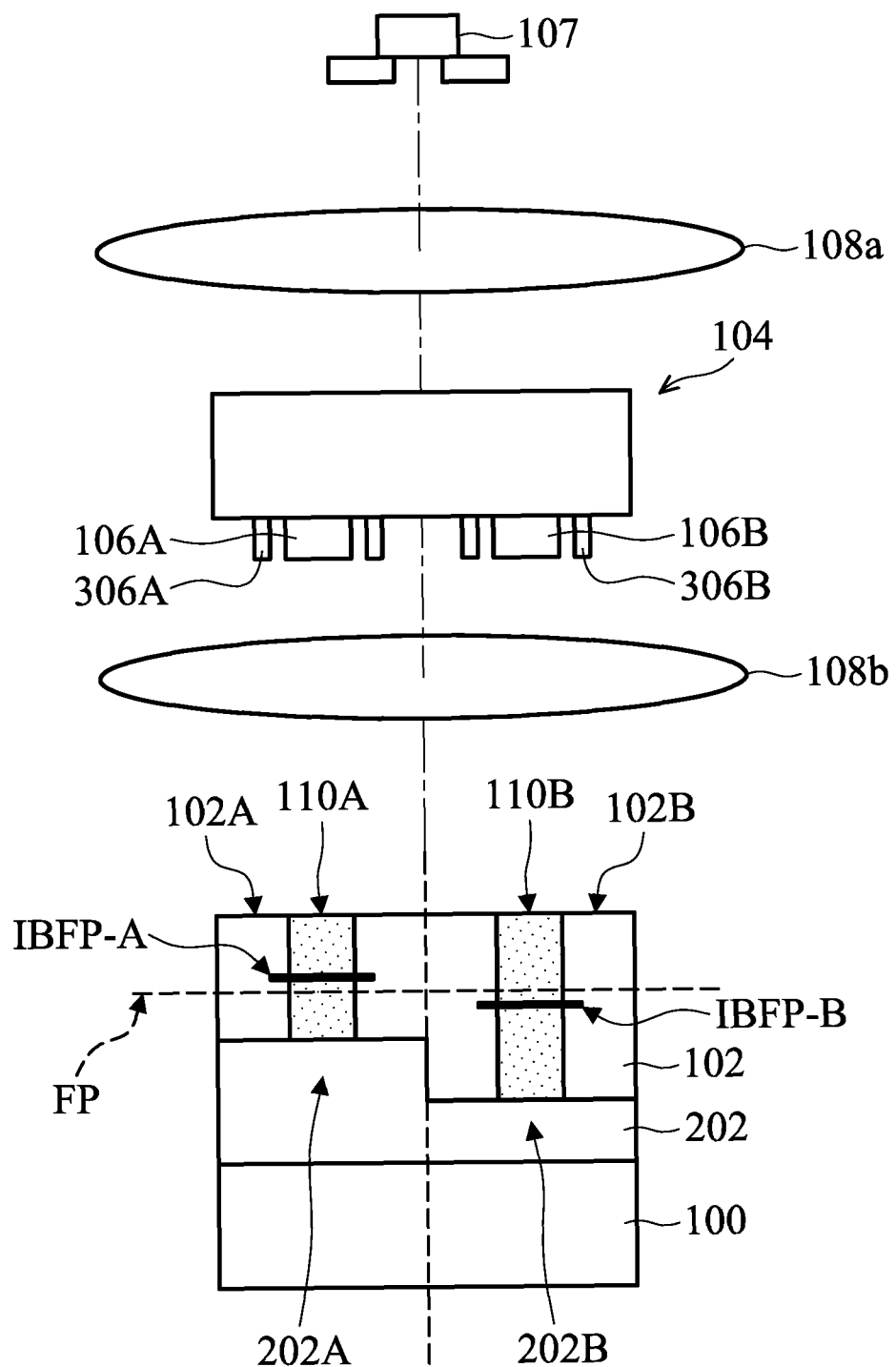
FIG. 3A is a cross-sectional view of an intermediate stage of a lithography process, in accordance with some embodiments.
Figure 3B:
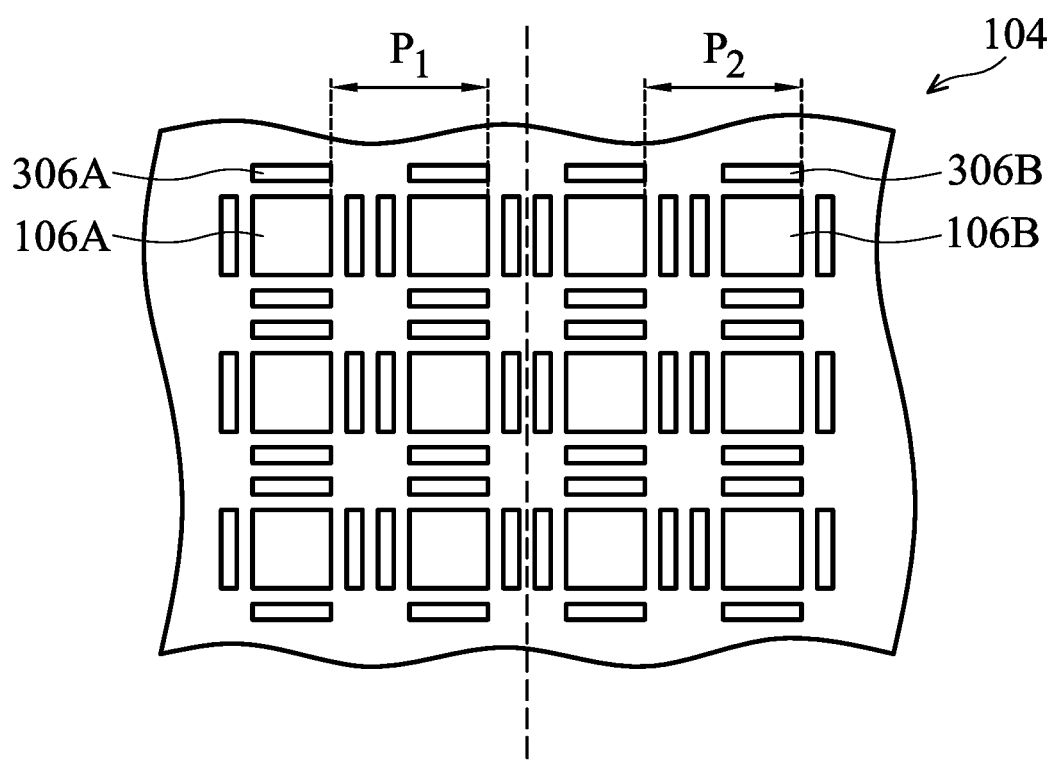
FIG. 3B is a top view of a mask, in accordance with some embodiments.

FIG. 3A is a cross-sectional view of an intermediate stage of a lithography process, in accordance with some embodiments. FIG. 3B is a top view of a mask with patterns, in accordance with some embodiments. In some embodiments, FIG. 3B shows the top view of the mask 104 shown in FIG. 3A. As shown in FIGS. 3A and 3B, the mask 104 further includes assist features 306A and 306B, in accordance with some embodiments. In some embodiments, the assist features 306A and 306B are not intended or desired to print as features or patterns in the resist layer 102. The assist features 306A and 306B is used to modify the image of a nearby main pattern.

In some embodiments, the assist features 306A and 306B include sub-resolution assist feature (SRAF) which are features outside edges of the main features, such as the first patterns 106A and the second patterns 106B. In some embodiments, the assist features 306A and 306B are sub-resolution inverse features (SRIF) which are features scooped out from inside the edges of the main features, such as the first patterns 106A and the second patterns 106B. The assist features 306A and 306B may be used to adjust the diffractive behavior of the formed patterns 110A and 110B.

In some cases, the first pattern 106A, the second pattern 106B, and the assist features 306A and 306B are designed without considering the regional information (or local exposure condition) at the first target portion 102A and the second target portion 102B. In these cases, the shapes, sizes, and distributions of the assist features 306A are substantially the same as those of the assist features 306B.

However, as mentioned above, the regional information (or local exposure condition) at the first target portion 102A is different from that at the second target portion 102B. Due to different local exposure conditions, the individual best focus position IBFP-A for the first pattern 106A and the individual best focus position IBFP-B for the second pattern 106B are positioned at different vertical levels with respect to the bottom surface of the substrate 100, as shown in FIG. 3A.

In some embodiments, the process parameters of the exposure tool 10 may be fine-tuned to set a particular focus position FP. However, as shown in FIG. 3A, the focus position FP is between the individual best focus positions IBFP-A and IBFP-B. Therefore, individual process window of the first pattern 106A and the second pattern 106B are not fully overlapped. It makes the common process window smaller than either the individual process window of 106A or 106B.

In accordance with some embodiments, the first pattern 106A and the second pattern 106B are designed based on obtained regional information (or local exposure condition) at the first target portion 102A and the second target portion 102B. Therefore, the first pattern 106A may be projected at a desired focus position that is substantially at the individual best focus position IBFP-A. Similarly, the second pattern 106B may also be projected at a desired focus position that is substantially at the individual best focus position IBFP-B. As a result, the quality of the patterns 110A and 110B accordingly formed in the resist layer 102 may be ensured. In these cases, the individual process window of the first pattern 106A and the second pattern 106B have more overlapping or even fully overlapped. It makes the common process window larger than when 106A and 106B are far away to each other.

Figure 4:
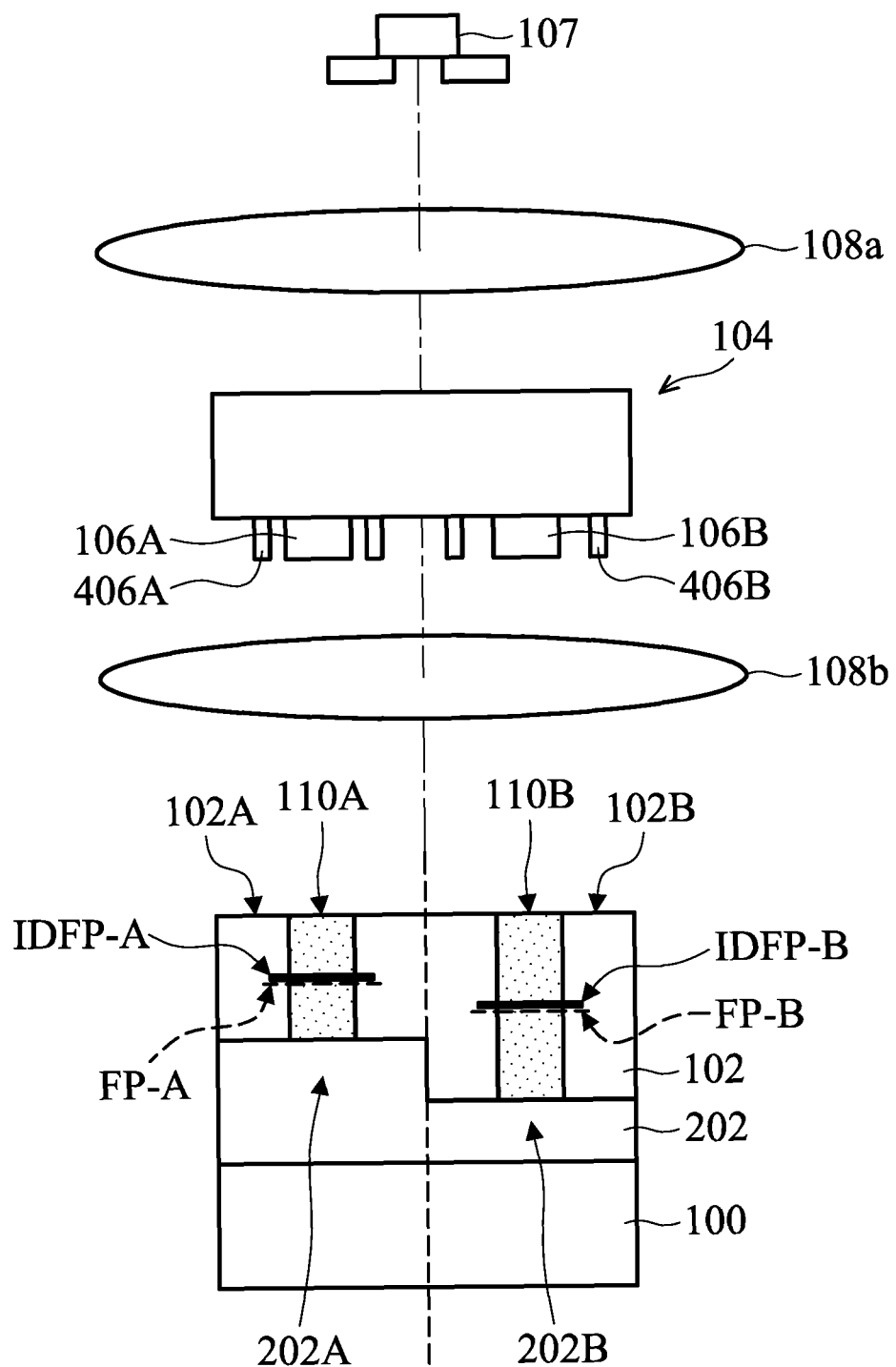
FIG. 4 is a cross-sectional view of an intermediate stage of a lithography process, in accordance with some embodiments.
Figure 11:
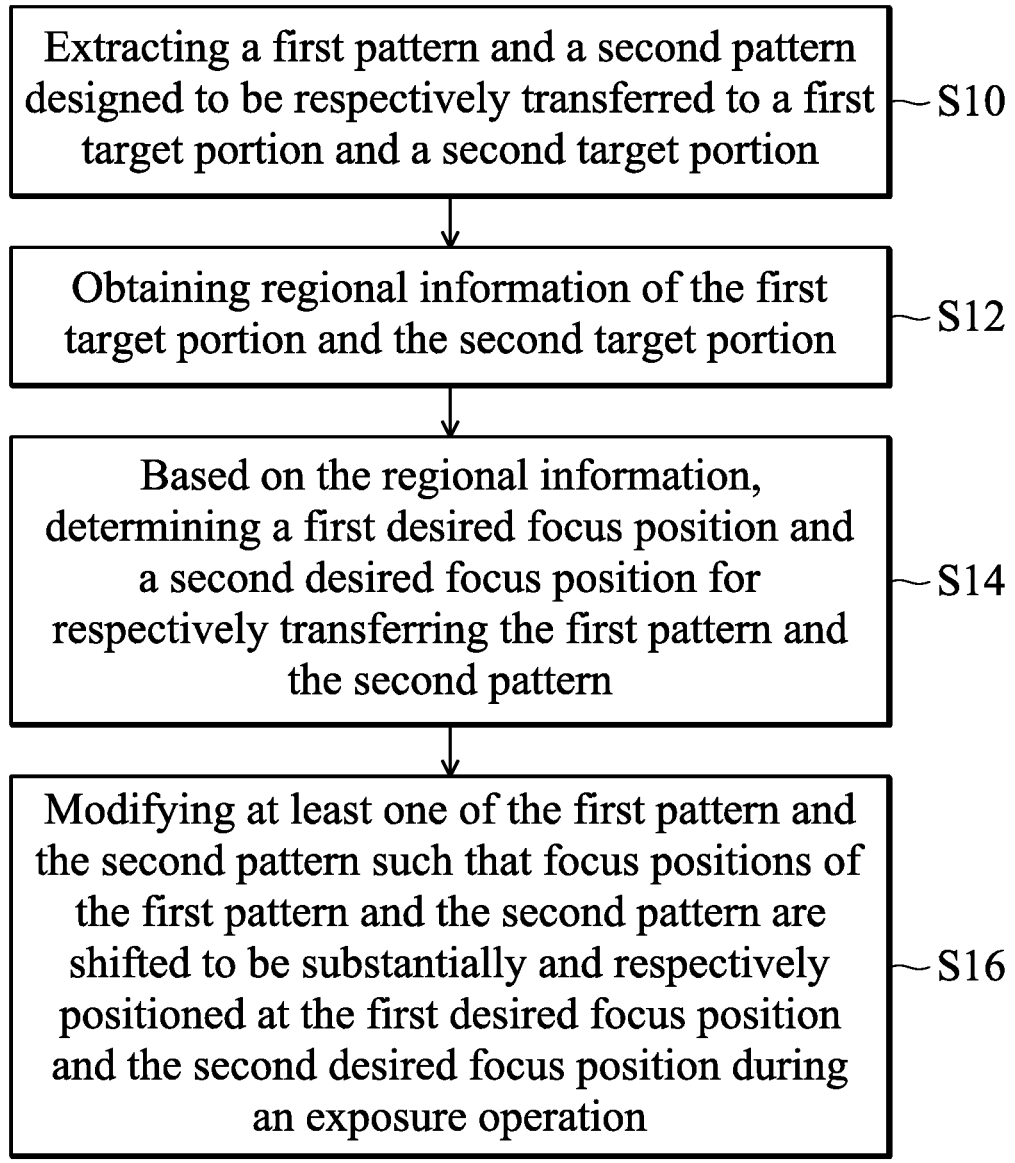
FIG. 11 is a flow chart of a method for pattern modification, in accordance with some embodiments.

FIG. 11 is a flow chart of a method for pattern modification, in accordance with some embodiments. FIG. 4 is a cross-sectional view of an intermediate stage of a lithography process, in accordance with some embodiments. The embodiments illustrated in FIG. 4 may use the method illustrated in FIG. 11.

As shown in FIG. 11, the method begins with an operation S10 in which a first pattern and a second pattern are extracted, in accordance with some embodiments. The first pattern (such as the patterns 106A) and the second pattern (such as the patterns 106B) are designed to be respectively transferred to a first target portion (such as the portion 102A) and a second target portion (such as the portion 102B).

As shown in FIG. 11, the method continues with an operation S12 in which regional information of the first target portion and the second target portion are obtained, in accordance with some embodiments. In some embodiments, the regional information (or exposure condition) is obtained using a microscope, simulation software, or a combination thereof. The microscope may include a scanning electron microscope (SEM), an atomic force microscope (AFM), an optical metrology, a transmission electron microscope (TEM), the like, or a combination thereof. The simulation software may be used to predict the regional information (or exposure condition) with the input of some process parameters and/or experimental results.

As shown in FIG. 11, the method continues with an operation S14 in which a first desired focus position and a second desired focus position for respectively transferring the first pattern and the second pattern are determined based on the regional information obtained during the operation S12. Based on the obtained regional information (or exposure condition) in operation S12, the first desired focus position and a second desired focus position may be determined more precisely. As shown in FIG. 4, a first (individual) desired focus position IDFP-A for the first pattern 106A and a second (individual) desired focus position IDFP-B for the second pattern 106B are determined, in accordance with some embodiments.

In some embodiments, the first desired focus position IDFP-A is the best focus position for transferring the first pattern 106A to the first target portion 102A. In some embodiments, the first desired focus position IDFP-A is close to the common best focus position for transferring the first pattern 106A to the first target portion 102A. In some embodiments, the second desired focus position IDFP-B is the best focus position for transferring the second pattern 106B to the second target portion 102B. In some embodiments, the second desired focus position IDFP-B is close to the common best focus position for transferring the second pattern 106B to the second target portion 102B. In some embodiments, the first desired focus position IDFP-A and the second desired focus position IDFP-B are determined based on an experimental result, a simulation result, or a combination thereof.

Afterwards, the method continues with an operation S16 in which one or both of the first pattern and the second pattern are modified. As a result, focus positions of the first pattern and the second pattern are shifted to be substantially and respectively positioned at the first desired focus position and the second desired focus position during an exposure operation.

As shown in FIG. 4, the first pattern 106A and the second pattern 106B are modified, in accordance with some embodiments. After the modification, the focus positions of the first pattern 106A and the second pattern 106B are shifted to be positioned at different vertical levels with respect to the bottom surface of the substrate 100. Compared with the embodiments illustrated in FIG. 2 or 3A, the focus position of the first pattern 106A is shifted upwards from the focus position FP to the focus position FP-A. The focus position of the second pattern 106B is shifted downwards from the focus position FP to the focus position FP-B.

In some embodiments, the first pattern 106A and the second pattern 106B are carefully modified. As a result, the focus position FP-A of the first pattern 106A is substantially positioned at the first desired focus position IDFP-A during the exposure operation. Meanwhile, the focus position FP-B of the second pattern 106B is substantially positioned at the second desired focus position IDFP-B during the exposure operation. In some embodiments, the first desired focus position IDFP-A and the second desired focus position IDFP-B are the best focus positions for transferring the patterns 106A and 106B. Therefore, the quality of the patterns 110A and 110B accordingly formed in the resist layer 102 may be ensured.

The modification of the first pattern 106A and the second pattern 106B may include tuning of serif feature of first pattern 106A or the second pattern 106B, forming one or more assist features near or in the first pattern 106A and the second pattern 106B, another suitable modification of the first pattern 106A or the second pattern 106B, or a combination thereof. In some embodiments, the shape or size of the first pattern 106A or the second pattern 106B are changed or modified. In some embodiments, the assist features include sub-resolution assist features (SRAF), sub-resolution inverse features (SRIF), other suitable features, or a combination thereof. In some embodiments, the sizes, positions, numbers of sub-layers, intensity, phase, and/or polarization of the first pattern 106A, the second pattern 106B, and/or the assist features are varied and/or modified to modify the first pattern 106A and the second pattern 106B.

Figure 9A:
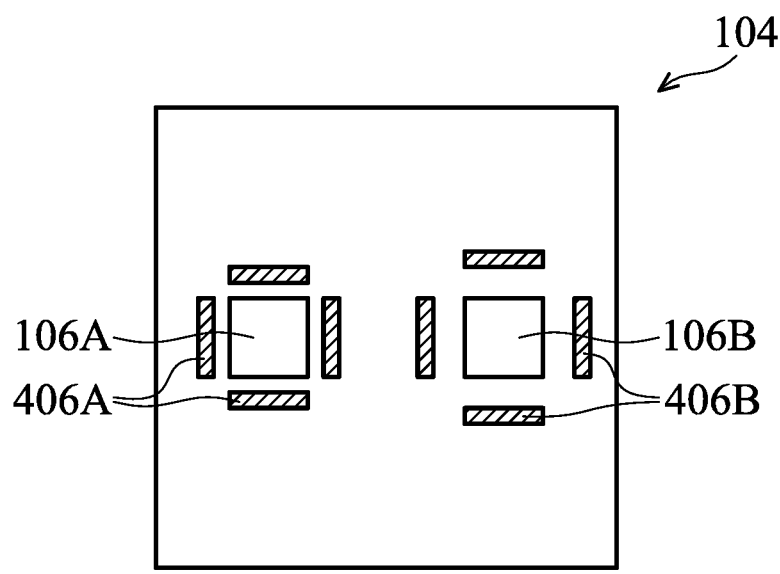
FIGS. 9A-9G are top views of a mask, in accordance with some embodiments.
Figure 9B:
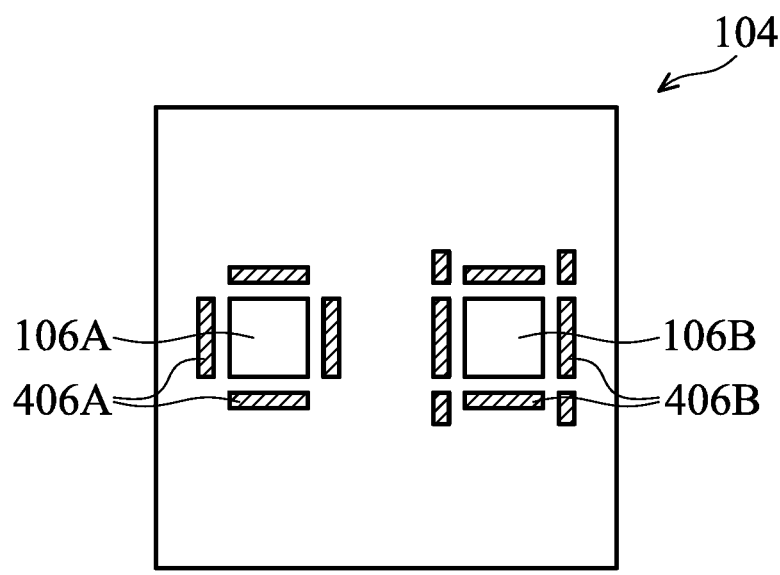
Figure 9C:
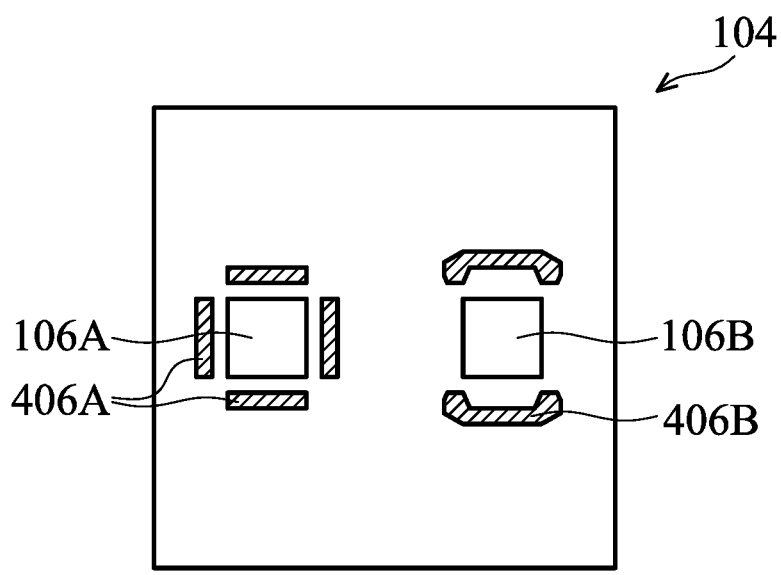

FIGS. 9A-9G are top views of a mask, in accordance with some embodiments. In some embodiments, FIGS. 9A-9G show some modification of the first pattern 106A or the second pattern 106B, in accordance with some embodiments. As shown in FIGS. 9A, 9B, and 9C, assist features 406A and 406B (such as SRAFs) are formed near the first pattern 106A and/or the second pattern 106B to modify the first pattern 106A and/or the second pattern 106B. As shown in FIGS. 9A, 9B, and 9C, the positions, sizes, shapes, and/or numbers of the assist features 406A and/or 406B may be fine-tuned to respectively adjust the focus positions for transferring the first pattern 106A and the second pattern 106B.

Figure 9D:
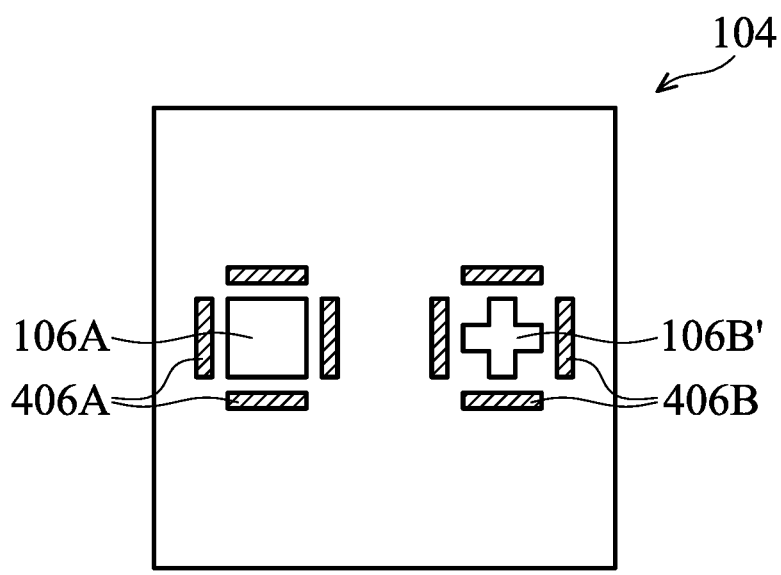
Figure 9E:
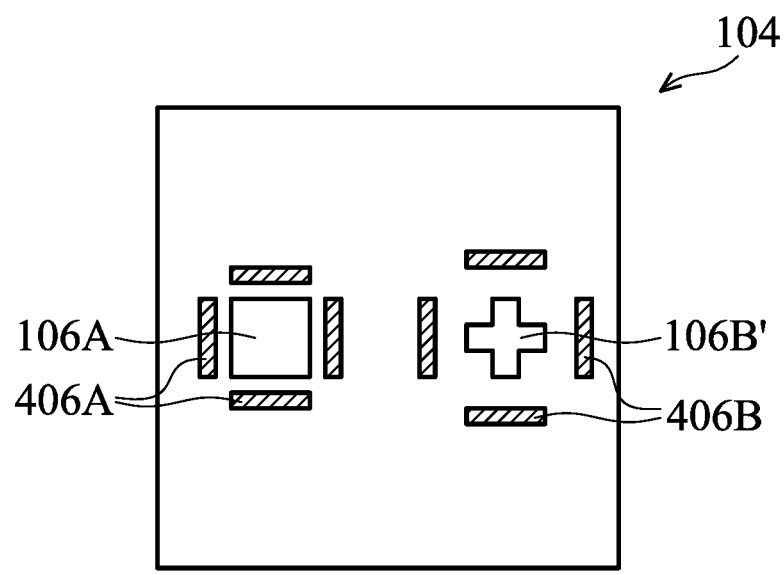

In some embodiments, the main pattern of the first pattern 106A or the second pattern 106B is varied or modified. As shown in FIG. 9D, the shape of the second pattern 106B is changed, in accordance with some embodiments. The modified second pattern is denoted as 106B' in FIG. 9D. After the modification of the patterns of the mask 104, the focus positions during an exposure operation may be respectively shifted to be positioned at or shifted to be close to the desired focus positions. In some other embodiments, both of the assist features 406B (such as SRAFs) and the shape of the second pattern 106B are changed or modified, as shown in FIG. 9E.

Figure 9F:
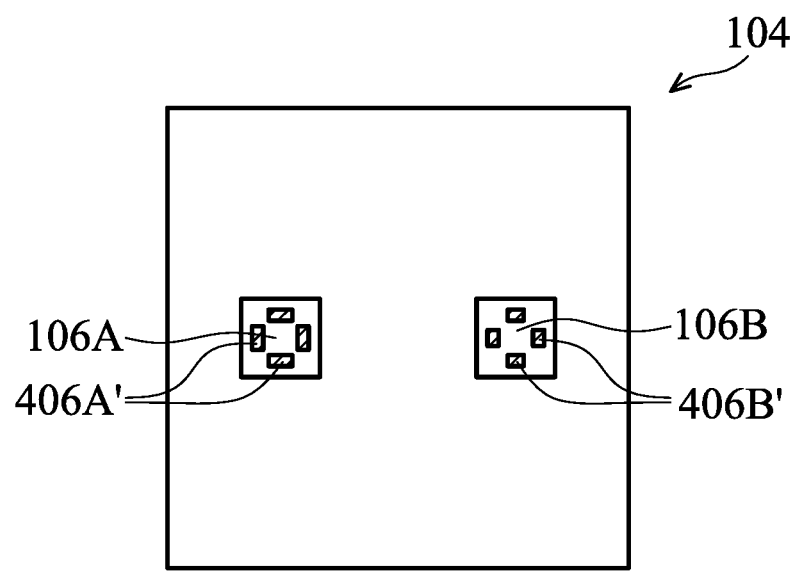
Figure 9G:
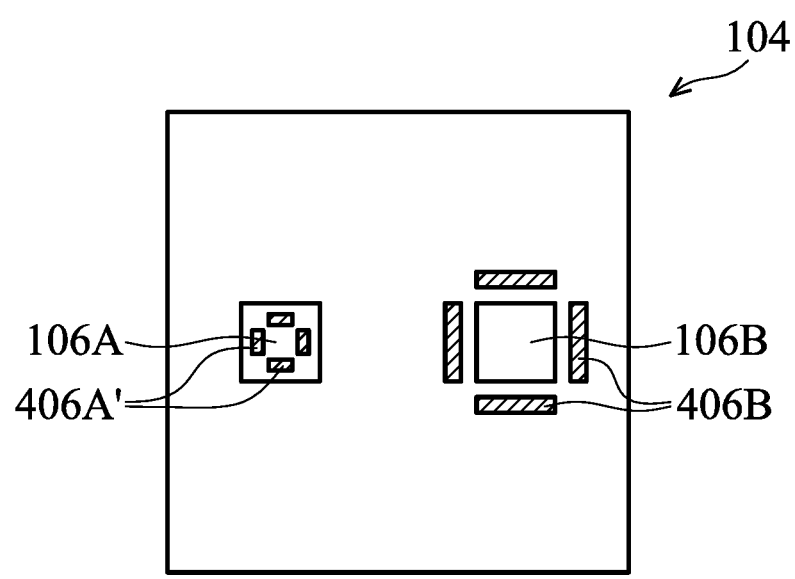

In some embodiments, the assist features are SRIFs, as shown in FIG. 9F. In some embodiments, the first pattern 106A and the second pattern 106B are modified to have features 406A' and 406B' that are scooped out from inside the edges of the first patterns 106A and the second patterns 106B, as shown in FIG. 9F. In some other embodiments, the first pattern 106A is modified to have assist features 406A' inside the first pattern 106A, and the second pattern 106B is modified to have assist features 406B outside of the second pattern 106B, as shown in FIG. 9G.

Figure 5:
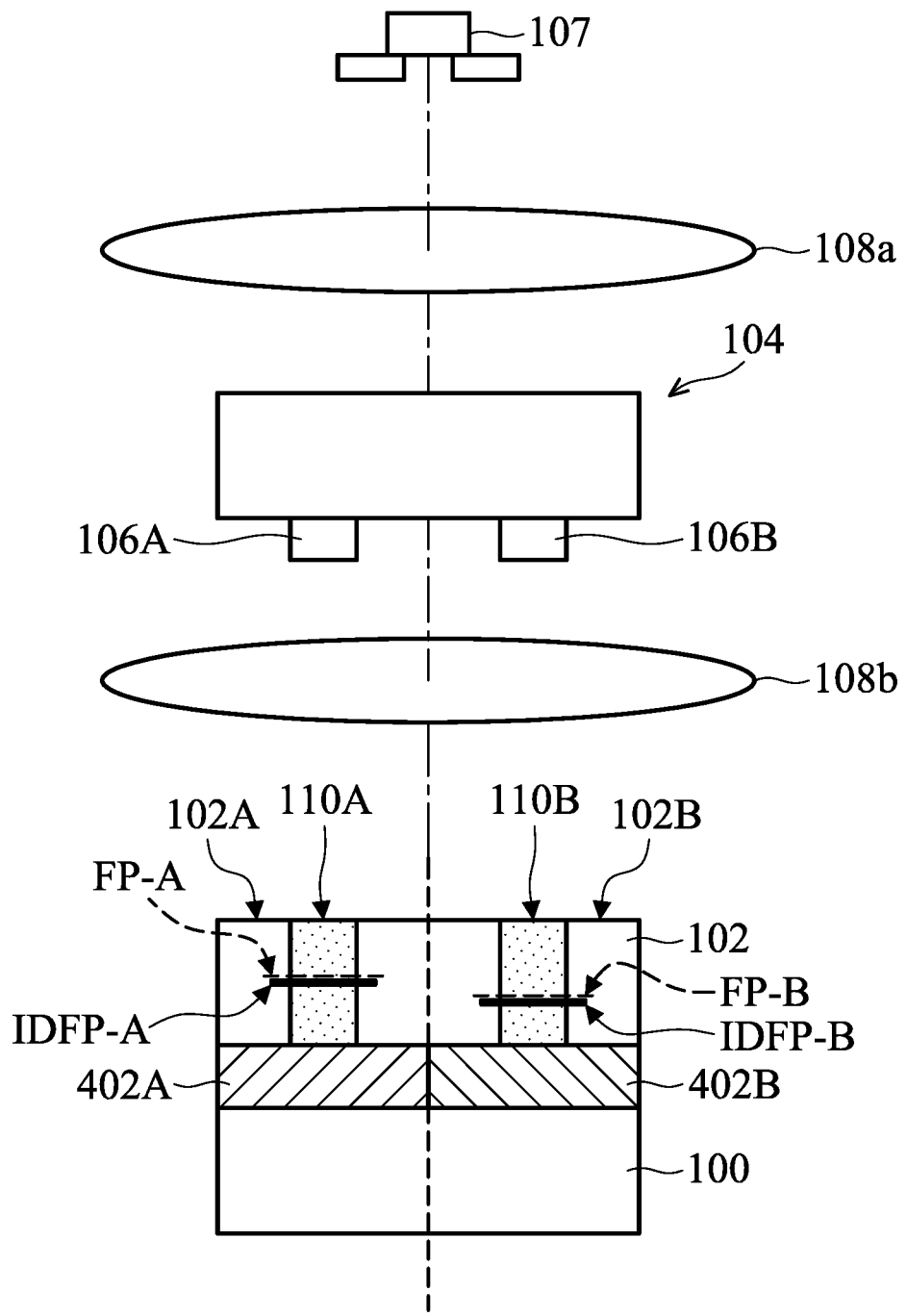
FIG. 5 is a cross-sectional view of an intermediate stage of a lithography process, in accordance with some embodiments.

FIG. 5 is a cross-sectional view of an intermediate stage of a lithography process, in accordance with some embodiments. In some embodiments, the method illustrated in FIG. 11 is applied to the embodiments in FIG. 5. In some embodiments, the operation S12 includes discovering that there is a first layer 402A between the first target portion 102A and the substrate 100 and a second layer 402B between the second target portion 102B and the substrate 100. In some embodiments, the operation S12 includes discovering that the materials of the first layer 402A and the second layer 402B are different from each other. In some embodiments, the operation S12 includes discovering that the first layer 402A has a reflectivity that is different from that of the second layer 402B.

In some embodiments, based on the obtained regional information, the first desired focus position IDFP-A for transferring the first pattern 106A and the second desired focus position IDFP-B for transferring the second pattern 106B are determined, as shown in FIGS. 5 and 11 in accordance with some embodiments. Afterwards, the first pattern 106A and the second pattern 106B are modified, as shown in FIGS. 5 and 11. As a result, the focus positions of the first pattern 106A and the second pattern 106B are shifted to be substantially and respectively positioned at the first desired focus position IDFP-A and the second desired focus position IDFP-B during an exposure operation. For example, one or a combination of the modification methods illustrated in FIGS. 9A-9G may be used.

With the consideration of the regional information (or local exposure condition) between different target portions, the patterns intended to be transferred to these target portions may be exposed at corresponding desired focus positions (for example, individual best focus positions). Therefore, the quality of the patterns accordingly formed in the resist layer 102 is high. For example, the first pattern 106A and the second pattern 106B can have a larger process window.

Figure 6:
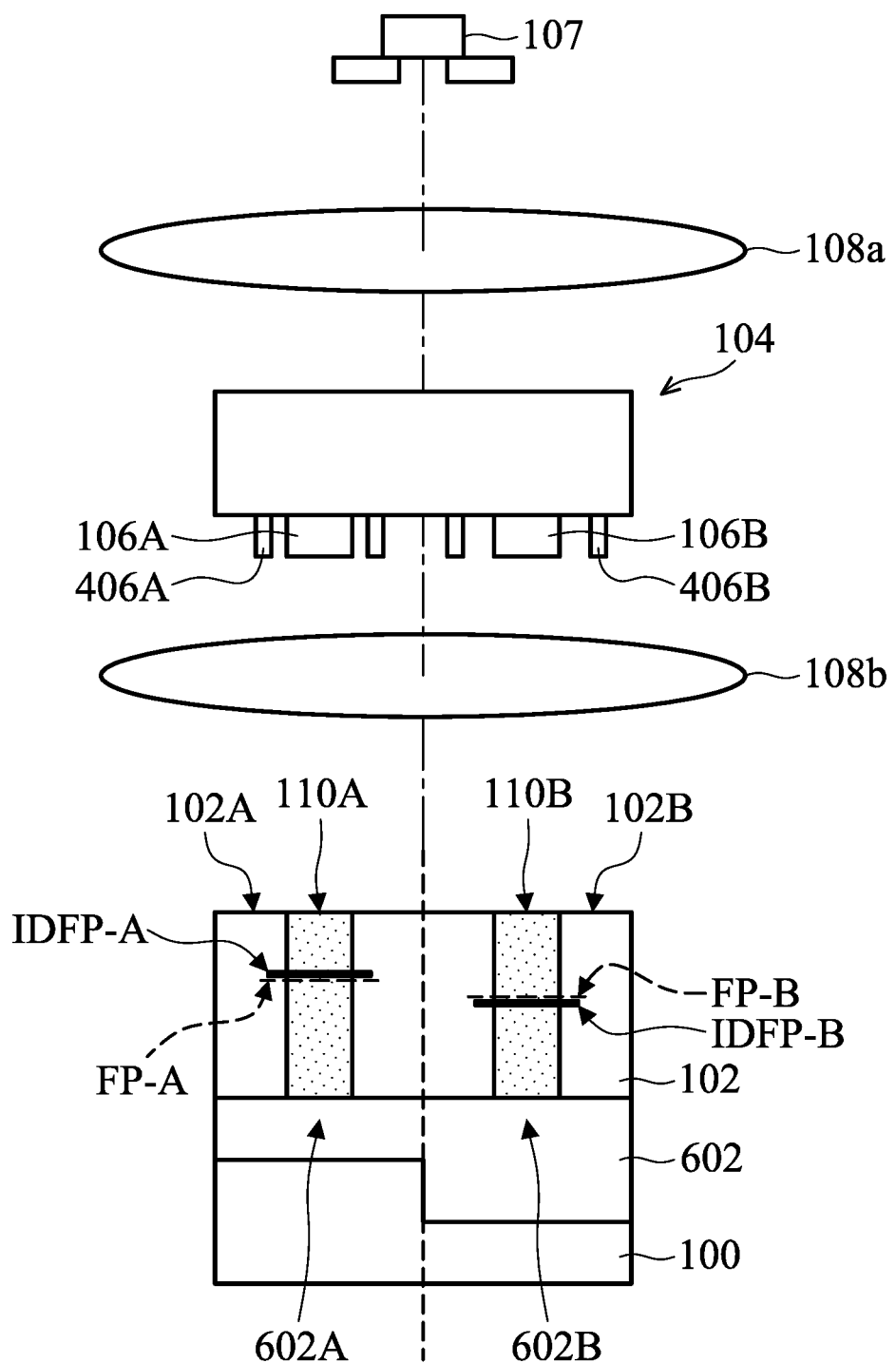
FIG. 6 is a cross-sectional view of an intermediate stage of a lithography process, in accordance with some embodiments.

FIG. 6 is a cross-sectional view of an intermediate stage of a lithography process, in accordance with some embodiments. In some embodiments, the method illustrated in FIG. 11 is applied to the embodiments in FIG. 6. In some embodiments, the operation S12 includes discovering that there is a material layer 602 between the substrate 100 and the resist layer 102. In some embodiments, the operation S12 includes discovering that the material layer 602 has a first portion 602A directly below the first target portion 102A and a second portion 602B directly below the second target portion 102B. The first portion 602A is thinner than the second portion 602B. In some embodiments, the operation S12 includes discovering that top surfaces of the first portion 602A and the second portion 602B are substantially coplanar with each other.

In some embodiments, based on the obtained regional information, the first desired focus position IDFP-A for transferring the first pattern 106A and the second desired focus position IDFP-B for transferring the second pattern 106B are determined, as shown in FIGS. 6 and 11 in accordance with some embodiments. Afterwards, the first pattern 106A and the second pattern 106B are modified, as shown in FIGS. 6 and 11. For example, assist features 406A and 406B are formed. As a result, the focus positions of the first pattern 106A and the second pattern 106B are shifted to be substantially and respectively positioned at the first desired focus position IDFP-A and the second desired focus position IDFP-B during an exposure operation. For example, one or a combination of the modification methods illustrated in FIGS. 9A-9G may be used.

With the consideration of the regional information (or local exposure condition) between different target portions, the patterns intended to be transferred to these target portions may be exposed at corresponding desired focus positions (for example, individual best focus positions). Therefore, the quality of the patterns accordingly formed in the resist layer 102 is improved.

Figure 7:
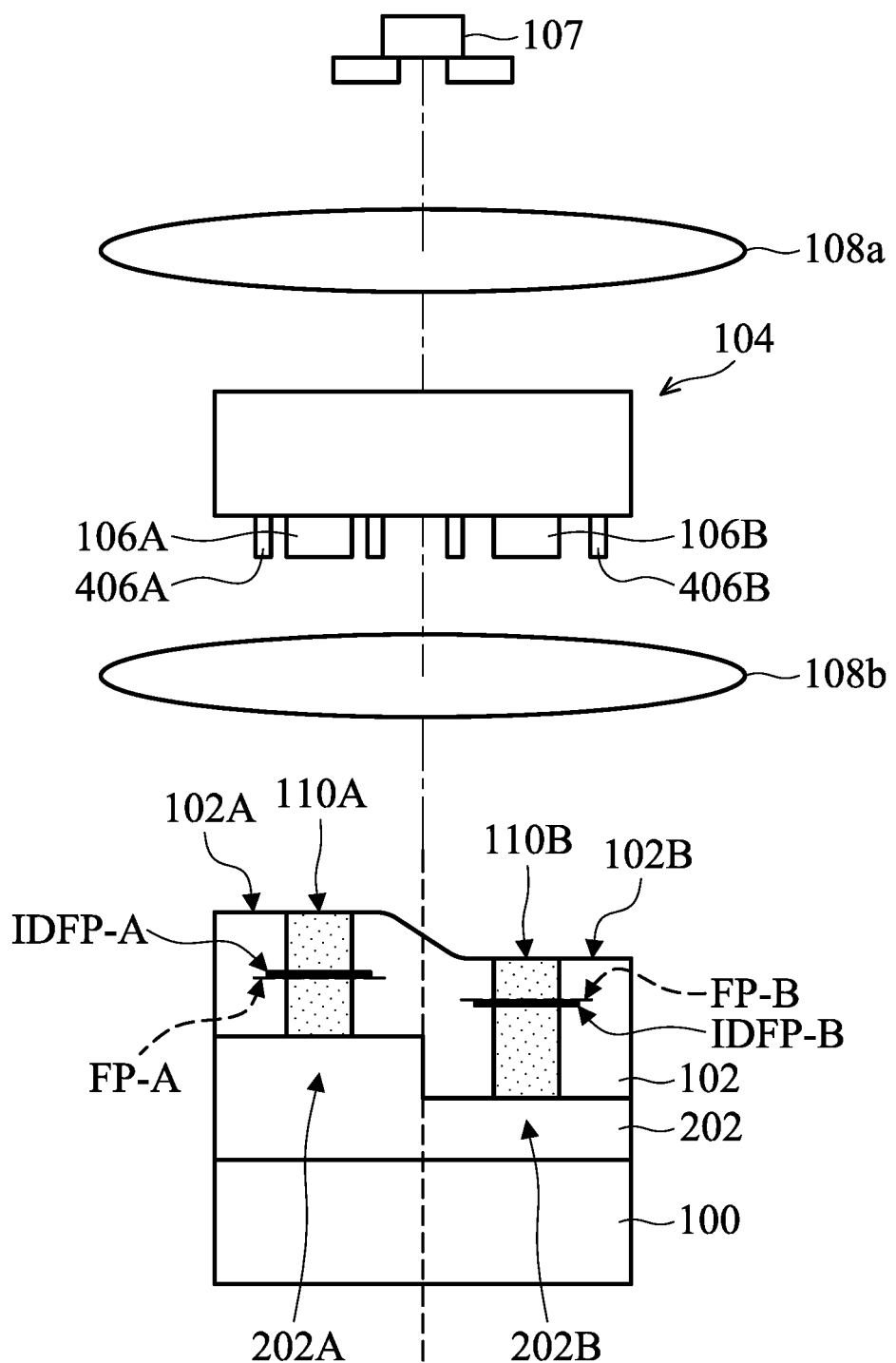
FIG. 7 is a cross-sectional view of an intermediate stage of a lithography process, in accordance with some embodiments.

FIG. 7 is a cross-sectional view of an intermediate stage of a lithography process, in accordance with some embodiments. In some embodiments, the method illustrated in FIG. 11 is applied to the embodiments in FIG. 7. In some embodiments, the operation S12 includes discovering that topography of the first target portion 102A is different from topography of the second target portion 102B.

In some embodiments, the operation S12 includes discovering that there is a material layer 202 between the substrate 100 and the resist layer 102. In some embodiments, the operation S12 includes discovering that the material layer 602 has a first portion 202A directly below the first target portion 102A and a second portion 202B directly below the second target portion 102B. The first portion 202A is thicker than the second portion 202B. In some embodiments, the operation S12 includes discovering that the top surface of the first portion 202A is at a higher vertical level than the top surface of the second portion 202B. In some embodiments, the operation S12 includes discovering that the top surfaces of the first target portion 102A and the second target portion 102B are at different vertical levels with respect to the bottom surface of the substrate 100.

In some embodiments, based on the obtained regional information, the first desired focus position IDFP-A for transferring the first pattern 106A and the second desired focus position IDFP-B for transferring the second pattern 106B are determined, as shown in FIGS. 7 and 11 in accordance with some embodiments.

Afterwards, the first pattern 106A and the second pattern 106B are modified, as shown in FIGS. 7 and 11. For example, assist features 406A and 406B are formed. As a result, the focus positions of the first pattern 106A and the second pattern 106B are shifted to be substantially and respectively positioned at the first desired focus position IDFP-A and the second desired focus position IDFP-B during an exposure operation. For example, one or a combination of the modification methods illustrated in FIGS. 9A-9G may be used.

With the consideration of the regional information (or local exposure condition) between different target portions, the patterns intended to be transferred to these target portions may be exposed at corresponding desired focus positions (for example, individual best focus positions). Therefore, the quality of the patterns accordingly formed in the resist layer 102 is improved.

Figure 8:
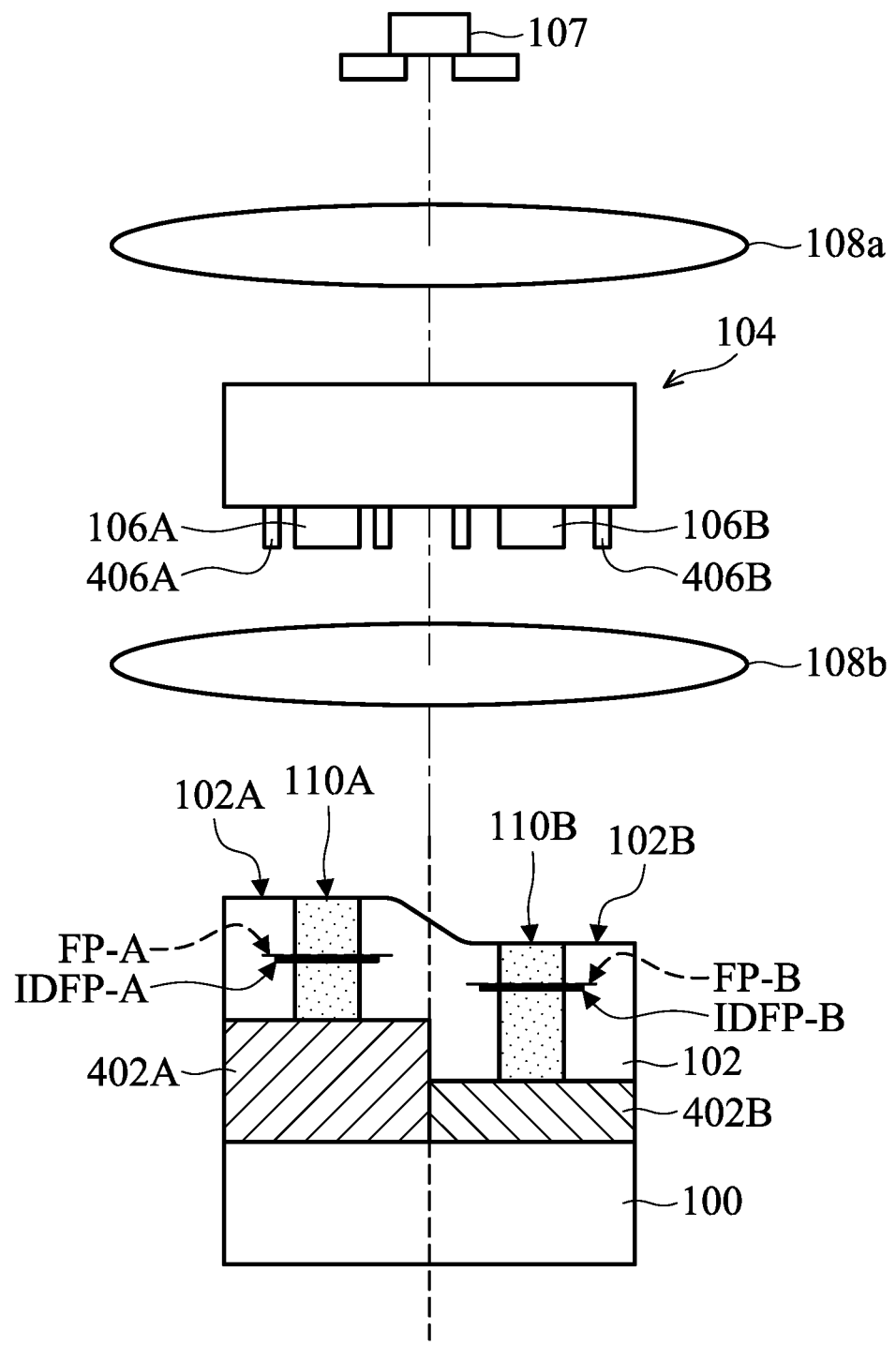
FIG. 8 is a cross-sectional view of an intermediate stage of a lithography process, in accordance with some embodiments.

FIG. 8 is a cross-sectional view of an intermediate stage of a lithography process, in accordance with some embodiments. In some embodiments, the method illustrated in FIG. 11 is applied to the embodiments in FIG. 8. In some embodiments, the operation S12 includes discovering that there is a first layer 402A between the substrate 100 and the first portion 102A of the resist layer 102. In some embodiments, the operation S12 includes discovering that there is a second layer 402B between the substrate 100 and the second portion 102B of the resist layer 102.

In some embodiments, the operation S12 includes discovering that the thicknesses, materials, and/or reflectivity of first layer 402A and the second layer 402B are different from each other. In some embodiments, the materials of the first layer 402A and the second layer 402B are different from each other. In some embodiments, the first layer 402A has a reflectivity that is different from that of the second layer 402.

In some embodiments, the operation S12 includes discovering that the first layer 402A is thicker than the second layer 402B. In some embodiments, the operation S12 includes discovering that the top surface of the first layer 402A is at a higher vertical level than the top surface of the second layer 402B. In some embodiments, the operation S12 includes discovering that the top surfaces of the first target portion 102A and the second target portion 102B are at different vertical levels with respect to the bottom surface of the substrate 100.

In some embodiments, based on the obtained regional information, the first desired focus position IDFP-A for transferring the first pattern 106A and the second desired focus position IDFP-B for transferring the second pattern 106B are determined, as shown in FIGS. 8 and 11 in accordance with some embodiments.

Afterwards, the first pattern 106A and the second pattern 106B are modified, as shown in FIGS. 7 and 11. For example, assist features 406A and 406B are formed. As a result, the focus positions of the first pattern 106A and the second pattern 106B are shifted to be substantially and respectively positioned at the first desired focus position IDFP-A and the second desired focus position IDFP-B during an exposure operation. For example, one or a combination of the modification methods illustrated in FIGS. 9A-9G may be used.

With the consideration of the regional information (or local exposure condition) between different target portions, the patterns intended to be transferred to these target portions may be exposed at corresponding desired focus positions (for example, individual best focus positions). Therefore, the quality of the patterns accordingly formed in the resist layer 102 is improved.

Figure 10A:
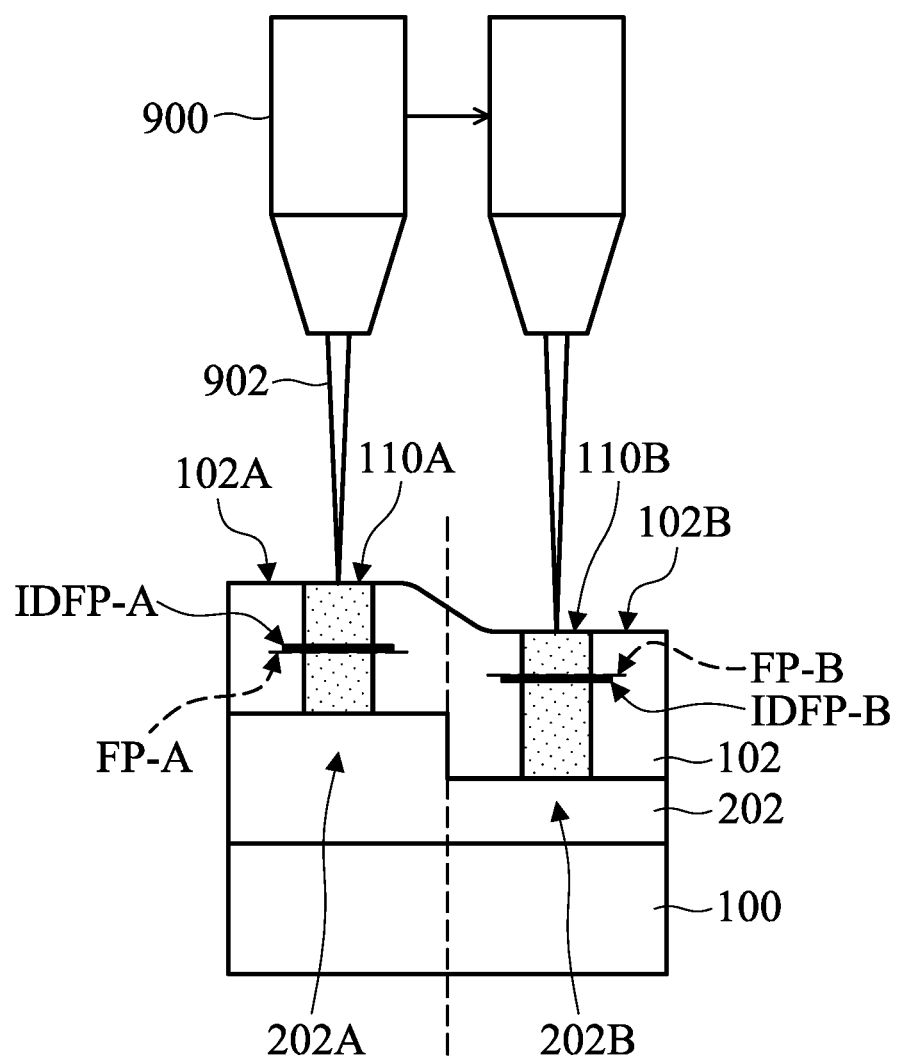
FIG. 10A is a cross-sectional view of an intermediate stage of a patterning process, in accordance with some embodiments.
Figure 12:
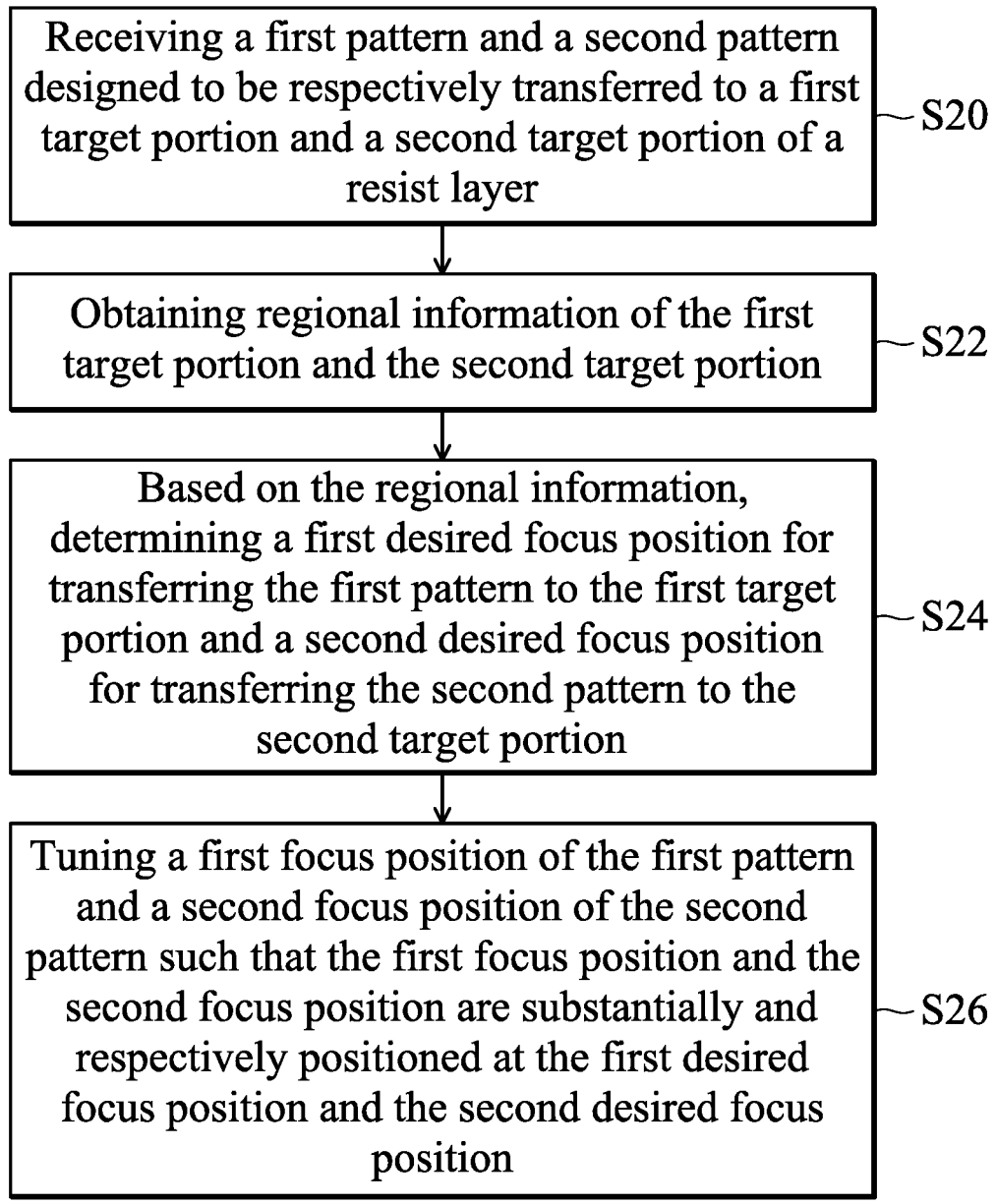
FIG. 12 is a flow chart of a method for pattern modification, in accordance with some embodiments.

Many variations and/or modifications can be made to embodiments of the disclosure. FIG. 10A is a cross-sectional view of an intermediate stage of a patterning process, in accordance with some embodiments. FIG. 12 is a flow chart of a patterning process, in accordance with some embodiments. In some embodiments, the method illustrated in FIG. 12 is used to perform the patterning process illustrated in FIG. 10A. In some embodiments, the patterning process illustrated in FIG. 10A is achieved by using an energy beam. In some embodiments, an energy beam provider 900 is used to provide an energy beam 902. The energy beam 902 may be used to direct write patterns onto a resist layer or a mask layer. In some embodiments, the energy beam 902 includes an electron beam, an ion beam, a laser beam, an x-ray beam, another suitable energy beam, or a combination thereof.

As shown in FIG. 12, the method begins with an operation S20 in which a first pattern and a second pattern designed to be respectively transferred to a first target portion and a second target portion of a resist layer are received. In some embodiments, similar to the embodiments illustrated in FIG. 7, the first pattern 106A is designed to be transferred to the first target portion 102A to form the first pattern 110A. The second pattern 106B is designed to be transferred to the second target portion 102B to form the second pattern 110B.

Afterwards, the method continues with an operation S22 in which regional information of the first target portion and the second target portion are obtained, as shown in FIG. 12 in accordance with some embodiments. In some embodiments, similar to the embodiments shown in FIG. 7 and the operation S12 illustrated in FIG. 11, the regional information of the first target portion 102A and the second target portion 102B are obtained. In some embodiments, the regional information (or direct writing condition) is obtained using a microscope, simulation software, or a combination thereof.

The method continues with an operation S24 in which a first desired focus position for transferring the first pattern to the first target portion and a second desired focus position for transferring the second pattern to the second target portion are determined based on the regional information obtained during the operation S22. As shown in FIG. 10A, considering the regional information and the characteristics of the energy beam 902, the first desired focus position IDFP-A and the second desired focus position IDFP-B are determined, in accordance with some embodiments.

The method continues with operation S26 in which a first focus position of the first pattern and a second focus position of the second pattern are tuned such that the first focus position and the second focus position are substantially and respectively positioned at the first desired focus position and the second desired focus position. In some embodiments, the energy beam provider 900 provides the energy beam 902 that is focus at the first desired focus position IDFP-A. Afterwards, the energy beam provider 900 is moved above the second target portion 102B and provides the energy beam 902 that is focus at the second desired focus position IDFP-B.

With the consideration of the regional information (or local direct writing condition) between different target portions, the patterns intended to be transferred to these target portions may be wrote at corresponding desired focus positions (for example, individual best focus positions). Therefore, the quality of the patterns accordingly formed in the resist layer 102 is improved.

Many variations and/or modifications can be made to embodiments of the disclosure. In some embodiments, the first focus position of the first pattern and the second focus position of the second pattern is tuned by modifying the first patterns and the second patterns such that focus positions of the first patterns and the second patterns are shifted to be substantially and respectively positioned at the first desired focus position and the second desired focus position during an exposure operation.

Figure 10B:
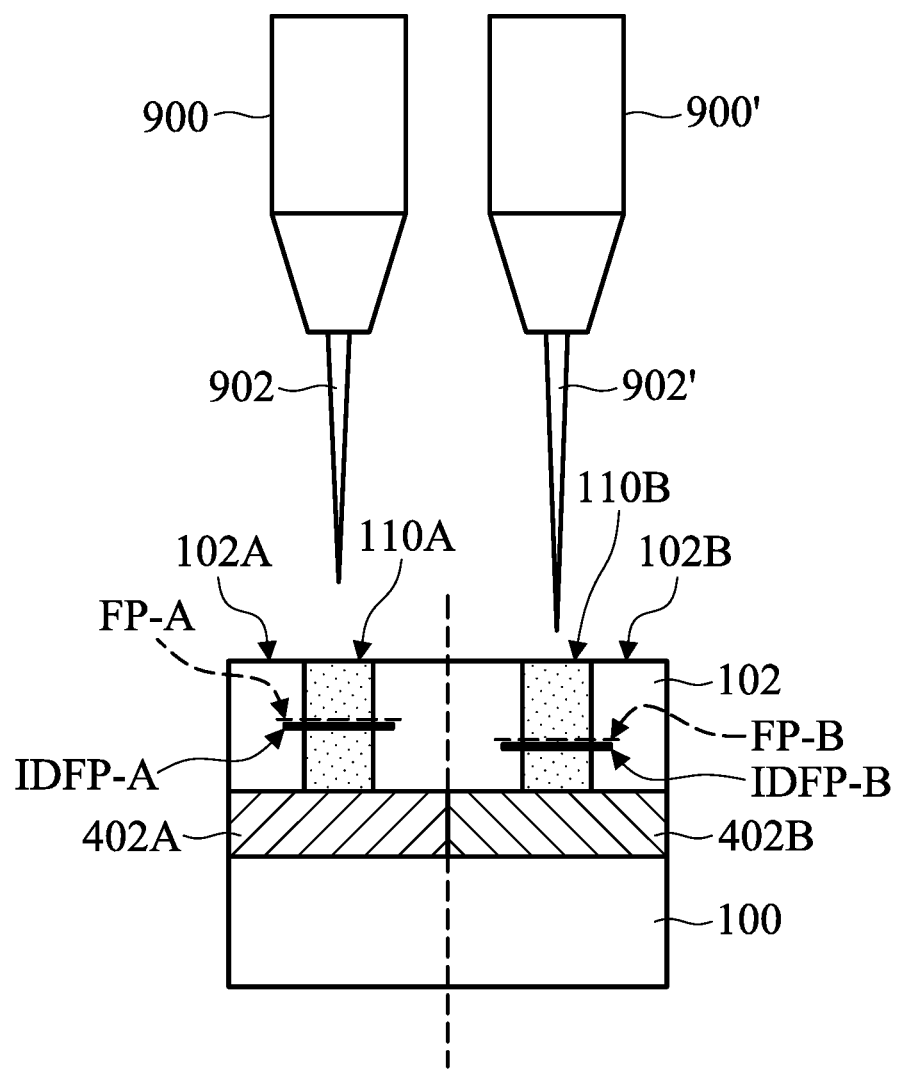
FIG. 10B is a cross-sectional view of an intermediate stage of a patterning process, in accordance with some embodiments.

Many variations and/or modifications can be made to embodiments of the disclosure. FIG. 10B is a cross-sectional view of an intermediate stage of a patterning process, in accordance with some embodiments. In some embodiments, multiple energy beam providers 900 and 900' are used. In some embodiments, energy beams 902 and 902' are provided at the same time. The energy beam 902 is fine-tuned to have the focus position FP-A that is substantially positioned at the first desired focus position IDFP-A. The energy beam 902' is also fine-tuned to have the focus position FP-B that is substantially positioned at the second desired focus position IDFP-B.

With the consideration of the regional information (or local direct writing condition) between different target portions, the patterns intended to be transferred to these target portions may be wrote at corresponding desired focus positions (for example, individual best focus positions). Therefore, the quality of the patterns accordingly formed in the resist layer 102 is improved.

Embodiments of the disclosure obtain regional information between different target portions where patterns are designed to be formed. With the considerations of the regional information, different desired focus positions (or best focus positions) are determined. The actual focus positions for transferring the patterns are tuned such that each of the actual focus positions is positioned at the corresponding desired focus position (or best focus position). The actual focus positions are tuned through pattern modification, such as adding assist features or modifying the shapes or sizes of the patterns. Alternatively, a direct writing tool may also be used to direct energy beam to focus at the desired focus positions (or best focus positions).

In accordance with some embodiments, a method for pattern modification is provided. The method includes extracting a first pattern and a second pattern designed to be respectively transferred to a first target portion and a second target portion of a resist layer over a substrate. The method also includes obtaining regional information of the first target portion and the second target portion. The method further includes determining a first desired focus position for transferring the first pattern to the first target portion based on the regional information. In addition, the method includes determining a second desired focus position for transferring the second pattern to the second target portion based on the regional information. The method includes modifying one or both of the first pattern and the second pattern. As a result, focus positions of the first pattern and the second pattern are shifted to be substantially and respectively positioned at the first desired focus position and the second desired focus position during an exposure operation.

In accordance with some embodiments, a method for pattern modification is provided. The method includes extracting a number of first patterns and a number of second patterns designed to be respectively transferred to a first target portion and a second target portion of a resist layer over a substrate. Shapes and sizes of each of the first patterns and the second patterns are substantially the same, and a first pitch between any adjacent two of the first patterns is substantially the same as a second pitch between any adjacent two of the second patterns. The method also includes obtaining regional information of the first target portion and the second target portion. The method further includes determining a first desired focus position for transferring the first patterns to the first target portion based on the regional information of the first target portion. In addition, the method includes determining a second desired focus position for transferring the second patterns to the second target portion based on the regional information of the second target portion. The method includes modifying the first patterns and the second patterns. As a result, focus positions of the first patterns and the second patterns are shifted to be substantially and respectively positioned at the first desired focus position and the second desired focus position during an exposure operation.

In accordance with some embodiments, a patterning process is provided. The method includes receiving a first pattern and a second pattern designed to be respectively transferred to a first target portion and a second target portion of a resist layer. The method also includes obtaining regional information of the first target portion and the second target portion. The method further includes determining a first desired focus position for transferring the first pattern to the first target portion based on the regional information. In addition, the method includes determining a second desired focus position for transferring the second pattern to the second target portion based on the regional information. The method includes tuning a first focus position of the first pattern and a second focus position of the second pattern such that the first focus position and the second focus position are substantially and respectively positioned at the first desired focus position and the second desired focus position.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for pattern modification, comprising:
   obtaining a first pattern and a second pattern that are designed to be respectively transferred during a to-be-performed exposure operation, wherein the first pattern and the second pattern are designed to be respectively transferred to a first target portion and a second target portion of a resist layer over a substrate, the first target portion and the second target portion are laterally positioned over different regions of the resist layer, and the to-be-performed exposure operation is a single exposure that simultaneously transfers the first pattern and the second pattern;
   obtaining regional information of the first target portion and the second target portion before the to-be-performed exposure operation;
   determining a first desired focus position for transferring the first pattern to the first target portion based on the regional information;
   determining a second desired focus position for transferring the second pattern to the second target portion based on the regional information; and
   modifying at least one of the first pattern and the second pattern before the to-be-performed exposure operation to allow focus positions of the first pattern and the second pattern to be shifted to be substantially and respectively positioned at the first desired focus position and the second desired focus position during the to-be-performed exposure operation.

2. The method for pattern modification as claimed in claim 1, wherein the first desired focus position and the second desired focus position are at different vertical levels with respect to a bottom surface of the substrate.

3. The method for pattern modification as claimed in claim 1, wherein sizes and shapes of the first pattern and the second pattern are substantially the same before modifying at least one of the first pattern and the second pattern.

4. The method for pattern modification as claimed in claim 1, wherein obtaining regional information of the first target portion and the second target portion comprises discovering that:
   there is a first layer between the first target portion and the substrate,
   there is a second layer between the second target portion and the substrate, and
   materials of the first layer and the second layer are different from each other.

5. The method for pattern modification as claimed in claim 1, wherein obtaining regional information of the first target portion and the second target portion comprises discovering that:
   there is a first layer between the first target portion and the substrate,
   there is a second layer between the second target portion and the substrate, and
   the first layer has a reflectivity that is different from that of the second layer.

6. The method for pattern modification as claimed in claim 1, wherein obtaining regional information of the first target portion and the second target portion comprises discovering that:
   there is a material layer between the substrate and the resist layer,
   the material layer has a first portion directly below the first target portion and a second portion directly below the second target portion,
   the first portion of the material layer is thicker than the second portion of the material layer, and
   a top surface of the first portion of the material layer is at a higher vertical levels than a top surface of the second portion of the material layer with respect to a bottom surface of the substrate.

7. The method for pattern modification as claimed in claim 6, wherein obtaining regional information of the first target portion and the second target portion further comprises discovering that top surfaces of the first target portion and the second target portion are at different vertical level with respect to the bottom surface of the substrate.

8. The method for pattern modification as claimed in claim 1, wherein obtaining regional information of the first target portion and the second target portion comprises discovering that:
   there is a material layer is between the substrate and the resist layer,
   the material layer has a first portion directly below the first target portion and a second portion directly below the second target portion,
   the first portion of the material layer is thinner than the second portion of the material layer, and
   top surfaces of the first portion and the second portion of the material layer are substantially coplanar with each other.

9. The method for pattern modification as claimed in claim 1, wherein modifying at least one of the first pattern and the second pattern comprises changing shape or size of the first pattern or the second pattern, forming one or more assist features near or in the first pattern or the second pattern, or a combination thereof.

10. The method for pattern modification as claimed in claim 9, wherein the one or more assist features comprise one or more sub-resolution assist features (SRAF), sub-resolution inverse features (SRIF), or a combination thereof.

11. The method for pattern modification as claimed in claim 1, wherein the regional information is obtained using a microscope, simulation software, or a combination thereof.

12. The method for pattern modification as claimed in claim 1, wherein the first desired focus position is the best focus position for transferring the first pattern to the first target portion, and the second desired focus position is the best focus position for transferring the second pattern to the second target portion.

13. The method for pattern modification as claimed in claim 1, wherein the first desired focus position and the second desired focus position are determined based on an experimental result, a simulation result, or a combination thereof.

14. A method for pattern modification, comprising:
obtaining a plurality of first patterns and a plurality of second patterns that are designed to be respectively transferred during a to-be-performed exposure operation, wherein the first patterns and the second patterns are designed to be respectively transferred to a first target portion and a second target portion of a resist layer over a substrate, the first target portion and the second target portion are laterally positioned over different regions of the resist layer, shapes and sizes of each of the first patterns and the second patterns are substantially the same, a first pitch between any adjacent two of the first patterns is substantially the same as a second pitch between any adjacent two of the second patterns, and the to-be-performed exposure operation is a single exposure that simultaneously transfers the first pattern and the second pattern;
obtaining regional information of the first target portion and the second target portion before the to-be-performed exposure operation;
determining a first desired focus position for transferring the first patterns to the first target portion based on the regional information of the first target portion;
determining a second desired focus position for transferring the second patterns to the second target portion based on the regional information of the second target portion; and
modifying the first patterns and the second patterns before the to-be-performed exposure operation to allow focus positions of the first patterns and the second patterns to be shifted to be substantially and respectively positioned at the first desired focus position and the second desired focus position during the to-be-performed exposure operation.

15. The method for pattern modification as claimed in claim 14, wherein obtaining regional information of the first target portion and the second target portion comprises discovering that topography of the first target portion is different from topography of the second target portion.

16. The method for pattern modification as claimed in claim 14, wherein obtaining regional information of the first target portion and the second target portion comprises discovering that:
a first material layer is between the first target portion and the substrate,
a second material layer is between the second target portion and the substrate, and
thicknesses, materials, or reflectivity of the first material layer and the second material layer are different from each other.

17. The method for pattern modification as claimed in claim 14, wherein modifying the first patterns and the second patterns comprises changing shape or size of the first patterns and the second patterns, forming one or more assist features near or in the first patterns and the second patterns, or a combination thereof.

18. A method for pattern modification, comprising:
receiving a first pattern and a second pattern that are designed to be respectively transferred during a to-be-performed exposure operation, wherein the first pattern and the second pattern are designed to be respectively transferred to a first target portion and a second target portion of a resist layer, the first target portion and the second target portion are laterally positioned over different regions of the resist layer, and the to-be-performed exposure operation is a single exposure that simultaneously transfers the first pattern and the second pattern;
obtaining regional information of the first target portion and the second target portion before the to-be-performed exposure operation;
determining a first desired focus position for transferring the first pattern to the first target portion based on the regional information;
determining a second desired focus position for transferring the second pattern to the second target portion based on the regional information; and
tuning a first focus position of the first pattern and a second focus position of the second pattern by modifying the first pattern and the second pattern before the to-be-performed exposure operation to allow the first focus position and the second focus position to be substantially and respectively positioned at the first desired focus position and the second desired focus position during the to-be-performed exposure operation.

19. The method for pattern modification as claimed in claim 18, wherein obtaining regional information of the first target portion and the second target portion comprises discovering that:
a first material layer is below the first target portion,
a second material layer is below the second target portion, and
thicknesses, materials, or reflectivity of the first material layer and the second material layer are different from each other.

20. The method for pattern modification as claimed in claim 18, wherein the first desired focus position and the second desired focus position are determined based on an experimental result, a simulation result, or a combination thereof.

* * * * *